United States Patent
Du et al.

(10) Patent No.: US 10,008,552 B2
(45) Date of Patent: Jun. 26, 2018

(54) ORGANIC LIGHT-EMITTING DISPLAY PANEL AND ELECTRONIC DEVICE

(71) Applicant: SHANGHAI TIANMA MICRO-ELECTRONICS CO., LTD., Shanghai (CN)

(72) Inventors: Lingxiao Du, Shanghai (CN); Liang Liu, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days. days.

(21) Appl. No.: 15/786,565

(22) Filed: Oct. 17, 2017

(65) Prior Publication Data

US 2018/0040674 A1 Feb. 8, 2018

(30) Foreign Application Priority Data

Jun. 30, 2017 (CN) .......................... 2017 1 0522415

(51) Int. Cl.
*H01L 27/32* (2006.01)
*G06F 3/041* (2006.01)
*H01L 51/52* (2006.01)

(52) U.S. Cl.
CPC .......... *H01L 27/323* (2013.01); *G06F 3/0414* (2013.01); *H01L 27/3248* (2013.01); *H01L 27/3276* (2013.01); *H01L 51/5203* (2013.01); *H01L 51/524* (2013.01)

(58) Field of Classification Search
CPC ...... G06F 3/041; G06F 3/0412; G06F 3/0414; H01L 27/32; H01L 51/52; H01L 27/323; H01L 27/3248; H01L 27/3276; H01L 51/5237; H01L 51/524; H01L 51/5246
See application file for complete search history.

(56) References Cited

U.S. PATENT DOCUMENTS

| | | | | |
|---|---|---|---|---|
| 2008/0239214 | A1* | 10/2008 | Lee ..................... | G02F 1/13338 349/106 |
| 2016/0064685 | A1* | 3/2016 | Kim ...................... | B32B 3/266 257/40 |
| 2017/0263887 | A1* | 9/2017 | Han .................... | H01L 27/3276 |
| 2017/0338294 | A1* | 11/2017 | Choi ................... | H01L 27/3276 |
| 2018/0053905 | A1* | 2/2018 | Lee ..................... | H01L 27/3262 |

* cited by examiner

*Primary Examiner* — Thanh T Nguyen
(74) *Attorney, Agent, or Firm* — Kilpatrick Townsend & Stockton LLP

(57) ABSTRACT

Disclosed are an organic light-emitting display panel and an electronic device. The organic light-emitting display panel comprises: an array substrate, wherein the array substrate comprises a display region and a non-display region surrounding the display region, and the array substrate further comprises a plurality of pressure-sensitive detection units and an encapsulation metal loop located in the non-display region surrounding the display region, a plurality of first metal wirings are partitioned from the encapsulation metal loop, the plurality of first metal wirings are electrically connected with the plurality of pressure-sensitive detection units and are reused as pressure-sensitive wirings of the plurality of pressure-sensitive detection units; and a sealant, wherein the sealant is located on one side of the array substrate that faces away from the encapsulation metal loop, and a projection of the sealant on the encapsulation metal loop overlaps with the encapsulation metal loop.

17 Claims, 20 Drawing Sheets

ORGANIC LIGHT-EMITTING DISPLAY PANEL AND ELECTRONIC DEVICE

CROSS-REFERENCE TO RELATED APPLICATIONS

This application claims priority to Chinese Patent Application No. 201710522415.9, filed on Jun. 30, 2017 and entitled "ORGANIC LIGHT-EMITTING DISPLAY PANEL AND ELECTRONIC DEVICE", the disclosure of which is incorporated herein by reference in its entirety.

TECHNICAL FIELD

Embodiments of the present disclosure relate to display technologies, and in particular, to an organic light-emitting display panel and an electronic device.

BACKGROUND

With the rapid development of the technologies of portable electronic terminal devices, especially mobile phones and tablets, more and more novel technologies are applied to these electronic terminal devices. Currently, a pressure-sensitive touch technology is one of the novel technologies which may cause concern in the field. Touch screens integrated with the pressure-sensitive touch screen technology may clearly distinguish between a touch action and a press action. When a user presses a screen, the touch screen integrated with a pressure sensor can exactly identify the pressure transferred by the user on the touch surface, thereby realizing different operations, for example, calling more control options in applications such as Message, Music and Calendar, etc.

The existing pressure sensor is generally integrated on the periphery of a display to detect whether the display is pressed and detect the magnitude of the pressure, thereby causing a wide frame.

SUMMARY

The present disclosure provides an organic light-emitting display panel and an electronic device, thereby realizing narrow frame.

In a first aspect, embodiments of the application provide an organic light-emitting display panel, which comprise: an array substrate, wherein the array substrate includes a display region and a non-display region surrounding the display region; the array substrate further includes a plurality of pressure-sensitive detection units and an encapsulation metal loop located in the non-display region and surrounding the display region, a plurality of first metal wirings are partitioned from the encapsulation metal loop, the plurality of first metal wirings are electrically connected with the plurality of pressure-sensitive detection units, and the plurality of first metal wirings are reused as pressure-sensitive wirings of the plurality of pressure-sensitive detection units; a sealant, wherein the sealant is located on one side of the array substrate that faces away from the encapsulation metal loop, and a projection of the sealant on the encapsulation metal loop overlaps with the encapsulation metal loop.

In a second aspect, embodiments of the disclosure further provide an electronic device, which includes the above organic light-emitting display panel.

In the organic light-emitting display panel according to one embodiment of the disclosure, a plurality of first metal wirings are partitioned from the encapsulation metal loop located in the non-display region of the array substrate and surrounding the display region, the plurality of first metal wirings can not only function to reflect laser to melt the sealant fully by the reflected laser, but also be reused as pressure-sensitive wirings of the plurality of pressure-sensitive detection units. In one embodiment of the disclosure, the existing encapsulation metal loop is etched to form a plurality of first metal wirings thereon, and the plurality of first metal wirings are taken as pressure-sensitive wirings of the pressure-sensitive detection units, so that on the basis that the reflection of laser by the encapsulation metal loop to melt the sealant fully by the reflected laser is not seriously affected, no pressure-sensitive wiring of the pressure-sensitive detection units needs to be provided separately, and hence the frame area occupied by the pressure-sensitive wirings of the pressure-sensitive detection units in the organic light-emitting display panel may be reduced, and a narrow frame may be realized while realizing a pressure-sensitive touch technology.

BRIEF DESCRIPTION OF THE DRAWINGS

Drawings needed in one embodiments of the disclosure will be introduced briefly below for more clearly illustrating the technical solutions of the exemplary embodiments of the disclosure. It will be apparent that, the drawings merely illustrate exemplary embodiments of the disclosure. Those skilled in the art can conceive other drawings from the illustrated drawings without inventive efforts.

DETAILED DESCRIPTION

The application will be illustrated in detail in conjunction with the drawings and embodiments. It may be understood that, embodiments described here are only set for explaining, rather than limiting, the application. Additionally, it further needs to be noted that, for convenient description, the drawings only show the parts related to the application, rather than the whole structure.

Figure 1A:
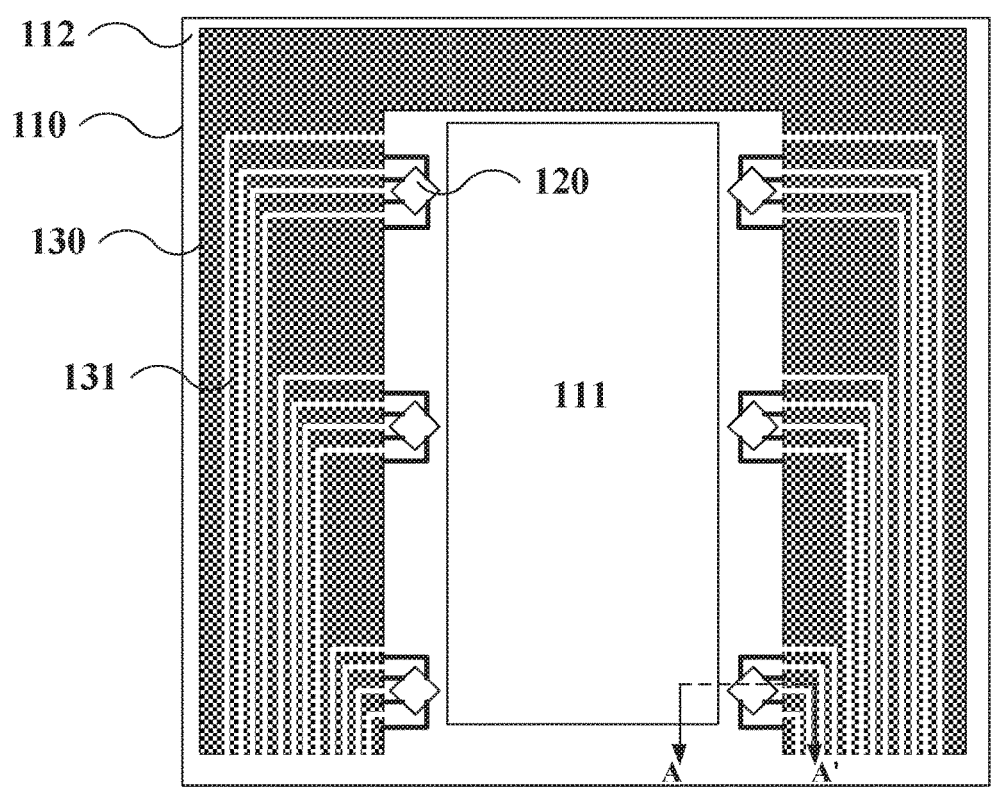
FIG. 1A is a schematic diagram of an organic light-emitting display panel according to an embodiment of the disclosure.
Figure 1B:
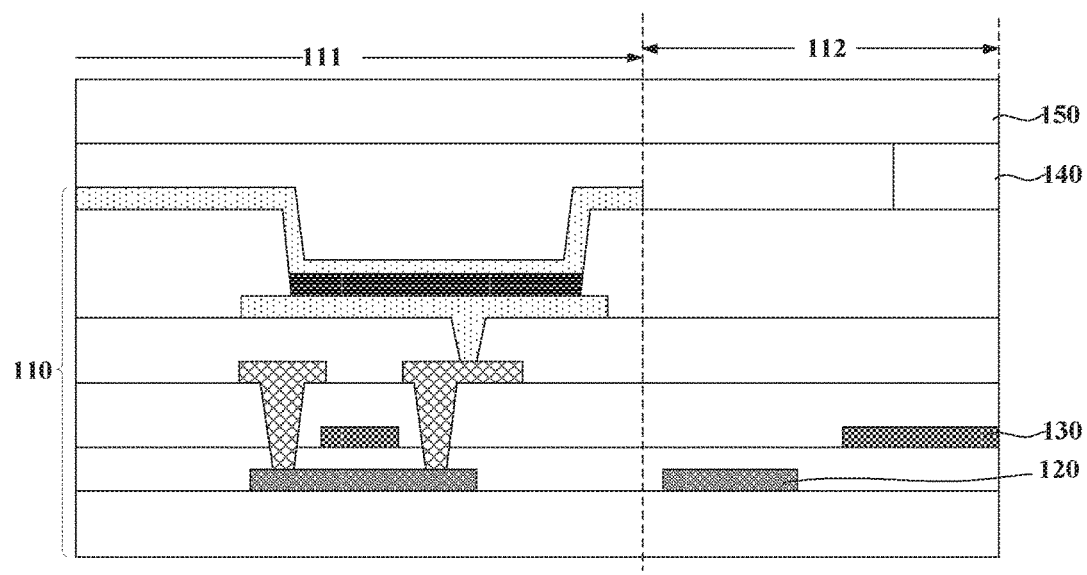
FIG. 1B is a sectional view of FIG. 1A taken along A-A'.

Referring to FIG. 1A, FIG. 1A is a schematic diagram of an organic light-emitting display panel according to an embodiment of the disclosure, and FIG. 1B is a sectional view of FIG. 1A taken along A-A'. In one embodiment of the disclosure, the organic light-emitting display panel includes: an array substrate 110, wherein the array substrate 110 includes a display region 111 and a non-display region 112 surrounding the display region 111, and the array substrate 110 further includes a plurality of pressure-sensitive detection units 120 and an encapsulation metal loop 130 located in the non-display region 112 and surrounding the display region 111, a plurality of first metal wirings 131 are partitioned from the encapsulation metal loop 130, the plurality of first metal wirings 131 are electrically connected with the plurality of pressure-sensitive detection units 120 and reused as pressure-sensitive wirings of the plurality of pressure-sensitive detection units 120; and a sealant 140, wherein the sealant 140 is located on one side of the array substrate 110 that faces away from the encapsulation metal loop 130, and a projection of the sealant 140 on the encapsulation metal loop 130 overlaps with the encapsulation metal loop 130.

In one embodiment of the disclosure, the organic light-emitting display panel includes an array substrate 110 and an encapsulation glass 150 provided opposite to the array substrate 110, the sealant 140 is located between the array substrate 110 and the encapsulation glass 150 and is configured to adhere the array substrate 110 and the encapsulation glass 150 to each other the array substrate 110 and the encapsulation glass 150 are adhered to each other by melting the sealant 140 via laser, wherein the laser is emitted from one side of the encapsulation glass 150 that faces away from the array substrate 110. Based on the arrangement that a projection of the sealant 140 on the encapsulation metal loop 130 overlaps with the encapsulation metal loop 130 and according to the light-blocking characteristic of the encapsulation metal loop 130, the encapsulation metal loop 130 can reflect the laser light to focus the light, so that the laser energy can be superposed, and hence the reaction between the laser and the sealant 140 can be fully conducted, and thus the sealant 140 can be fully melted, and the adhering effect between the array substrate 110 and the encapsulation glass 150 can be improved.

When being pressed, the pressure-sensitive detection unit 120 will be deformed and generate a corresponding strain voltage signal according to the magnitude of deformation, that is, the pressure-sensitive detection unit 120 will generate a corresponding strain voltage signal according to the magnitude of the pressure. The pressure-sensitive detection unit 120 includes four connection ends, namely, two voltage input terminals and two voltage output terminals respectively, and each connection terminal is electrically connected with a pressure-sensitive wiring. The pressure-sensitive detection unit 120 may be provided in the non-display region 112 of the array substrate 110, so that the pressure-sensitive wiring of the pressure-sensitive detection unit 120 will be left from the frame of the organic light-emitting display panel, thereby causing a wide frame.

In one embodiment of the disclosure, the organic light-emitting display panel is provided with an encapsulation metal loop 130, the encapsulation metal loop 130 functions to reflect laser and hence melt the sealant 140 fully by the reflected laser, so that the sealant 140 overlaps with the encapsulation metal loop 130 in the direction vertical to the organic light-emitting display panel, and the display effect would not be affected in the arrangement that the encapsulation metal loop 130 is located in the non-display region 112 of the array substrate 110 and surrounds the display region 111. The encapsulation metal loop 130 is made of a metal material, and the metal material contains free electrons, so that the encapsulation metal loop 130 made of the metal material has a good conductivity, and it can also function to prevent static electricity. Based on the configuration that the encapsulation metal loop 130 is located in the non-display region 112 of the array substrate 110 and surrounds the display region 111 and has a good conductivity, in one embodiment of the disclosure, the encapsulation metal loop 130 may be etched to form a plurality of slits thereon, thereby forming a plurality of first metal wirings 131. The plurality of first metal wirings 131 are electrically connected with the plurality of corresponding pressure-sensitive detection units 120. That is, the plurality of first metal wirings 131 may function as the pressure-sensitive wirings of the pressure-sensitive detection units 120. Because the slits made in the encapsulation metal loop 130 may form the plurality of first metal wirings 131, the function of the encapsulation metal loop 130 for reflecting laser and hence fully melting the sealant 140 by the reflected laser will not be seriously affected after partitioning.

In one embodiment of the disclosure, a plurality of first metal wirings 131 are partitioned from the encapsulation metal loop 130, and the plurality of first metal wirings 131 can not only function to reflect laser and fully melt the sealant 140 by the reflected laser, but also be electrically connected with the pressure-sensitive detection unit 120 to function as the pressure-sensitive wirings of the pressure-sensitive detection units 120. Specifically, for example, for any of the first metal wirings 131 partitioned from the encapsulation metal loop 130, the first metal wiring 131 may function to reflect laser, and also, the first metal wiring 131 can be electrically connected with a voltage terminal of one pressure-sensitive detection unit 120 to function as a pressure-sensitive wiring of the pressure-sensitive detection unit 120.

In one embodiment of the disclosure, the first metal wiring 131 is electrically connected with the voltage input terminal of one pressure-sensitive detection unit 120, so that the first metal wiring 131 can function as a pressure-sensitive drive wiring of the pressure-sensitive detection unit 120 while reflecting laser, and the organic light-emitting display panel transmits a pressure-sensitive drive signal to the pressure-sensitive detection unit 120 via the first metal wiring 131; if the first metal wiring 131 is electrically connected with the voltage output terminal of one pressure-sensitive detection unit 120, the first metal wiring 131 can further function as a pressure-sensitive induction wiring of the pressure-sensitive detection unit 120 while reflecting laser, and the organic light-emitting display panel acquires the strain voltage signal generated by the pressure-sensitive detection unit 120 via the first metal wiring 131.

It needs to be noted that, the first metal wiring 131 can still function to reflect laser and fully melt the sealant 140 by the reflected laser. It may be understood by one skilled in the art that, the partition mode and the partition number of the encapsulation metal loop may be adjusted according to the location of the pressure-sensitive detection unit and the number of needed pressure-sensitive wirings.

Referring to FIG. 1A, in one embodiment of the disclosure, illustration will be given by an example in which the organic light-emitting display panel is provided with six pressure-sensitive detection units 120, the number of the pressure-sensitive detection units 120 is not defined in one embodiment of the disclosure, and each pressure-sensitive detection unit 120 includes four pressure-sensitive wirings, then twenty-four first metal wirings 131 are partitioned from the encapsulation metal loop 130 to function as the pressure-sensitive wirings of six pressure-sensitive detection units 120, the twenty-four first metal wirings 131 are provided corresponding to and electrically connected with the six pressure-sensitive detection units 120 respectively.

For any pressure-sensitive detection unit 120 in the organic light-emitting display panel, four first metal wirings 131 may function as the four pressure-sensitive wirings of the pressure-sensitive detection unit 120, wherein the two first metal wirings 131 electrically connected with the two voltage input terminals of the pressure-sensitive detection unit 120 function as pressure-sensitive drive wirings, and the two first metal wirings 131 electrically connected with the two voltage output terminals of the pressure-sensitive detection unit 120 function as pressure-sensitive induction wirings. In the pressure-sensitive detection stage, the organic light-emitting display panel inputs a pressure-sensitive drive signal to the corresponding pressure-sensitive detection unit 120 via two pressure-sensitive drive wirings and acquires a strain voltage signal output by the pressure-sensitive detection unit 120 via two pressure-sensitive induction wirings. If it is not pressed, the strain voltage signal output by the pressure-sensitive detection unit 120 is 0; if a user presses the touch panel surface, the pressure-sensitive detection unit 120 is deformed under the action of the pressure, the strain voltage signal output by the pressure-sensitive detection unit 120 changes correspondingly according to the magnitude of deformation, so that the pressure-sensitive touch control can be realized in the organic light-emitting display panel by detecting the strain voltage signal. It may be understood by one skilled in the art that, the type, structure and working process of the pressure-sensitive detection unit are similar to those of the prior art, and no repeated description will be given again here.

Figure 2A:
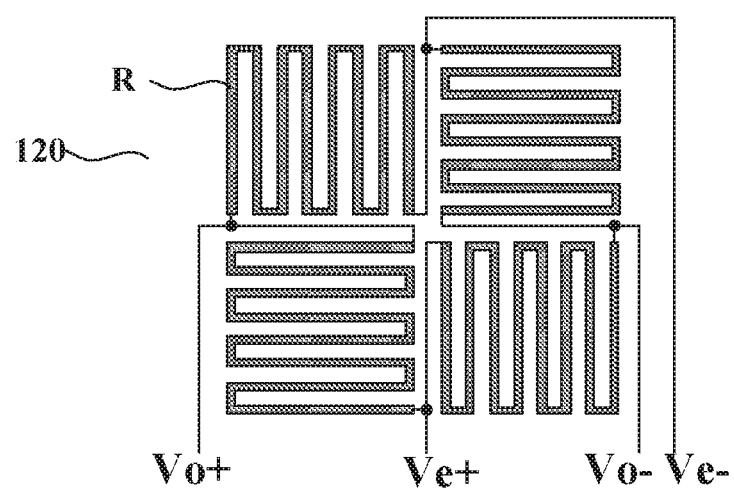
FIG. 2A is a schematic diagram of a pressure-sensitive detection unit according to an embodiment of the disclosure.

In one embodiment, referring to FIG. 2A, in one embodiment of the disclosure, the pressure-sensitive detection unit 120 may be a metal-bridge pressure sensor, and the metal-bridge pressure sensor includes four resistors R, two voltage input terminals (Vo+, Vo−) and two voltage output terminals (Ve+, Ve−). The four resistors R of the metal-bridge pressure sensor forms a Wheatstone bridge. In one embodiment of the disclosure, the pressure-sensitive detection unit 120 may be a varistor made of a metal material, that is, the pressure-sensitive detection unit 120 may be the metal-bridge pressure sensor. In one embodiment, any resistor R in the metal-bridge pressure sensors may be a serpentine metal thin-film wiring, and the four resistors R of the metal-bridge pressure sensor with resistors R in the form of a serpentine metal thin-film wiring are concentrated, and the advantage thereof lies in that: when the temperature changes locally, the temperature affections on resistors R are consistent with each other, so that the temperature effect may be eliminated to a certain extent, and in this case, Different temperatures would not cause unbalance in Wheatstone bridge for resistors R. In one embodiment, the pressure-sensitive wiring of the metal-bridge pressure sensor may be provided as the first metal wiring 131, which is favorable to realize narrow frame. It may be understood by one skilled in the art that, the structure and operating principle of the metal-bridge pressure sensor are similar to those of the prior art, and no repeated description will be given again here.

Figure 2B:
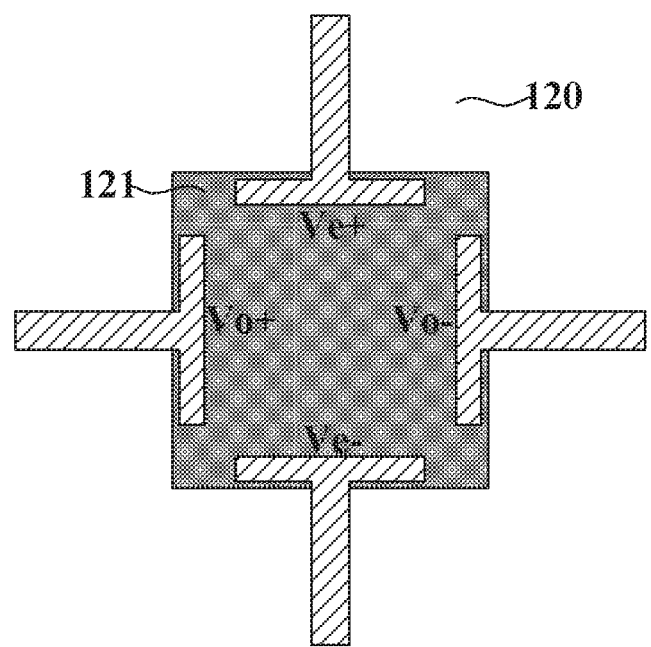
FIG. 2B is a schematic diagram of another pressure-sensitive detection unit according to an embodiment of the disclosure.

In one embodiment, referring to FIG. 2B, in one embodiment of the disclosure, the pressure-sensitive detection unit 120 may further be a semiconductor pressure sensor, and the semiconductor pressure sensor includes a semiconductor material film 121, two voltage input terminals (Vo+, Vo−) and two voltage output terminals (Ve+, Ve−). The straight line of the two voltage input terminals of the semiconductor pressure sensor intersects with the straight line of the two voltage output terminals thereof. In one embodiment of the disclosure, the pressure-sensitive detection unit 120 may be a variable resistor made of a semiconductor material, that is, the pressure-sensitive detection unit 120 may be a semiconductor pressure sensor. The semiconductor pressure sensor made of a semiconductor material has an advantage of high sensitivity and hence has a strong press sensing ability, so that it may effectively detect whether the organic light-emitting display panel is pressed and detect the magnitude of the pressure. On the other hand, the area of the semiconductor pressure sensor is small, and thus semiconductor pressure sensor may be selected in consideration of narrow frame. When the semiconductor pressure sensor is provided on the right and left frames of the organic light-emitting display panel, both of the right and left frames are usually provided with a shift register (VSR) configured to output a scanning signal to a scanning line, so that the semiconductor pressure sensor may be provided between the VSRs, that is, a free location may be provided between adjacent two levels of VSRs to arrange the semiconductor pressure sensor.

In the organic light-emitting display panel according to one embodiment of the disclosure, a plurality of first metal wirings are partitioned from the encapsulation metal loop located in the non-display region of the array substrate and surrounding the display region, the plurality of first metal wirings can not only function to reflect laser to melt the sealant fully by the reflected laser, but also be reused as pressure-sensitive wirings of the plurality of pressure-sensitive detection units. In one embodiment of the disclosure, the existing encapsulation metal loop is etched to form a plurality of first metal wirings thereon, and the plurality of first metal wirings are taken as pressure-sensitive wirings of the pressure-sensitive detection units, so that based on the configuration that the reflection of laser by the encapsulation metal loop to melt the sealant fully by the reflected laser is not seriously affected, no additional pressure-sensitive wiring of the pressure-sensitive detection units needs to be provided, and hence the frame area occupied by the pressure-sensitive wirings of the pressure-sensitive detection units in the organic light-emitting display panel may be reduced, thereby realizing both the narrow frame and the pressure-sensitive touch technology.

Figure 3A:
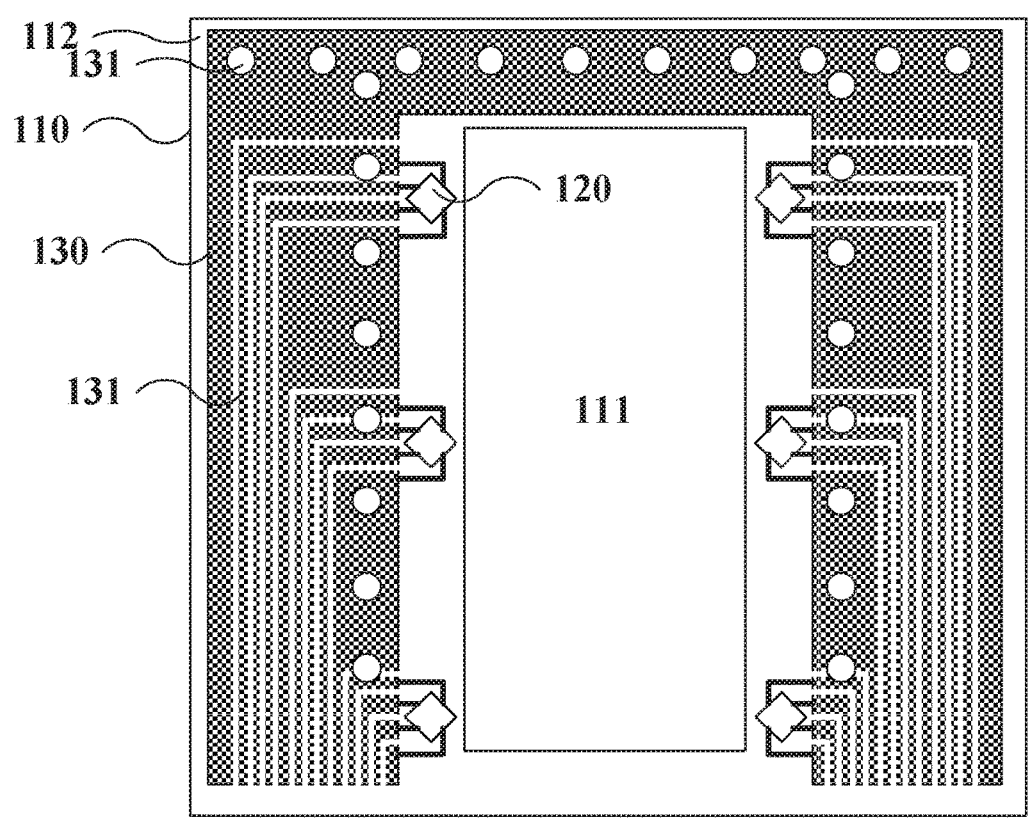
FIG. 3A is a schematic diagram of another organic light-emitting display panel according to an embodiment of the disclosure.
Figure 3B:
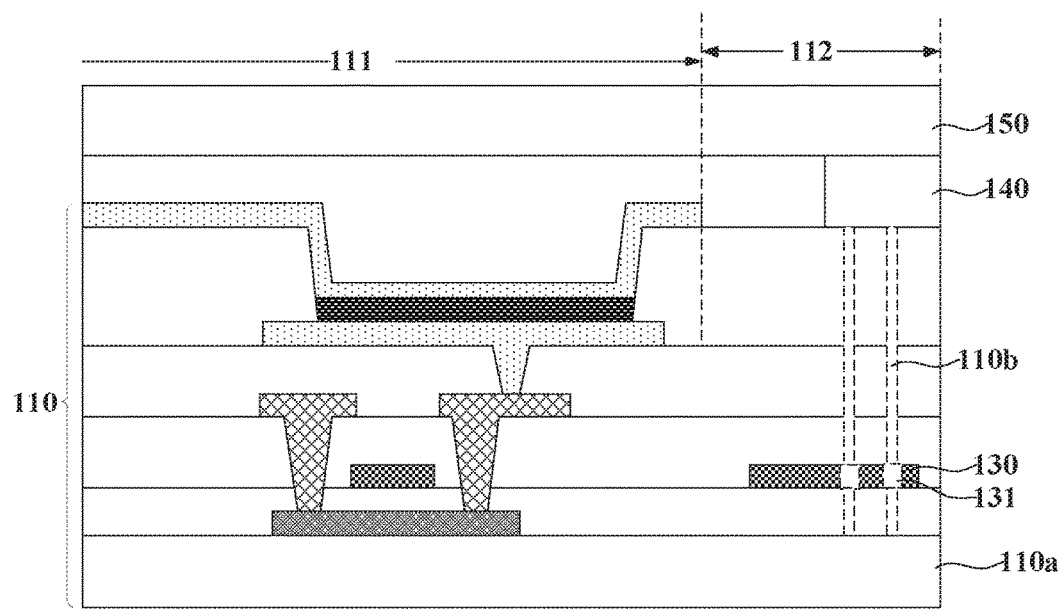
FIG. 3B is a sectional view of an organic light-emitting display panel according to an embodiment of the disclosure.

In one embodiment, referring to FIG. 3A and FIG. 3B, FIG. 3A is a schematic diagram of another organic light-emitting display panel according to an embodiment of the disclosure, and FIG. 3B is a sectional view of an organic light-emitting display panel according to an embodiment of the disclosure. The difference from any of the above organic light-emitting display panels lies in that, in this embodiment of the disclosure, the encapsulation metal loop 130 has a plurality of openings 131, the openings 131 are configured to improve the adhesion between the sealant 140 and the array substrate 110. In one embodiment of the disclosure, the organic light-emitting display panel includes an array substrate 110 and an encapsulation glass 150 provided opposite to the array substrate 110, and the sealant 140 is located between the array substrate 110 and the encapsulation glass 150 and configured to encapsulate the array substrate 110 and the encapsulation glass 150, so that the adhesiveness between the sealant 140 and the array substrate 110 can be increased by providing a plurality of openings 131 on the encapsulation metal loop 130.

In practice, the array substrate 110 includes a backing 110a and a plurality of film layer structures provided on the backing 110a. The sealant 140 can be made to directly contact the backing 110a of the array substrate 110 by providing a plurality of openings 110b at the location of the corresponding sealant 140 of each film layer structure of the array substrate 110, thereby improving the adhesion between the array substrate 110 and the encapsulation glass 150.

Figure 4A:
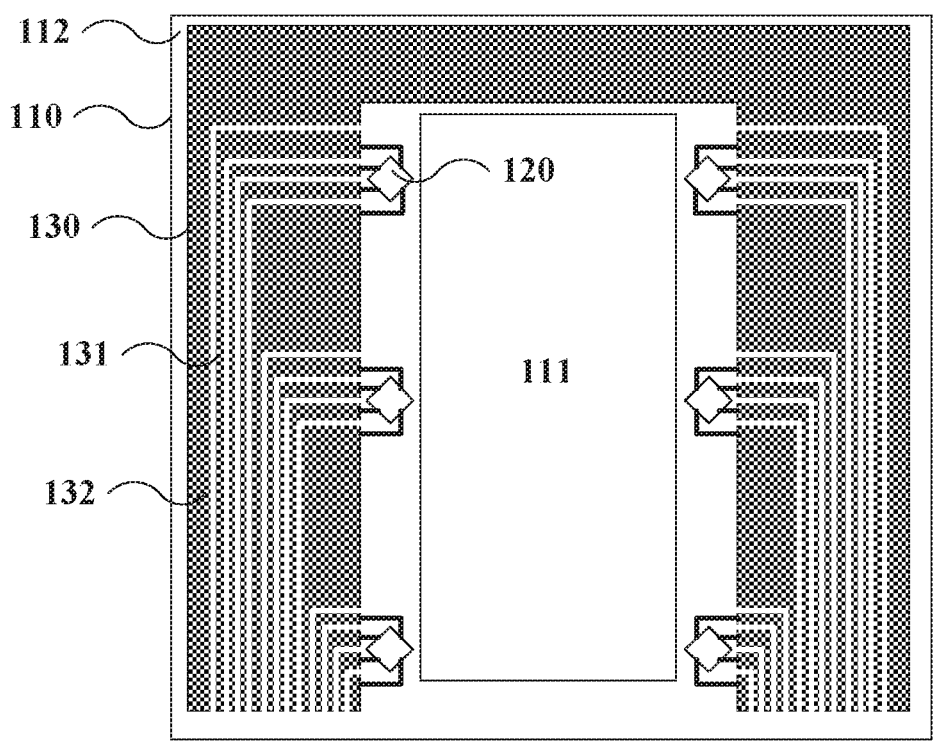
FIG. 4A is a schematic diagram of another organic light-emitting display panel according to an embodiment of the disclosure.

In one embodiment, referring to FIG. 4A, FIG. 4A is a schematic diagram of another organic light-emitting display panel according to an embodiment of the disclosure. The difference from any of the above organic light-emitting display panels lies in that, in this embodiment of the disclosure, a second metal wiring 132 surrounding the display region 111 is further partitioned from the encapsulation metal loop 130, the second metal wiring 132 is located on the outmost side of the plurality of first metal wirings 131 and surrounds the plurality of first metal wirings 131, and the second metal wiring 132 is reused as a ground wire of the organic light-emitting display panel. In one embodiment of the disclosure, a plurality of first metal wirings 131 are partitioned from the encapsulation metal loop 130, and the plurality of first metal wirings 131 need to be electrically connected with the pressure-sensitive detection unit 120. The remaining structure after the encapsulation metal loop 130 is etched is located on the outmost side of the plurality of first metal wirings 131, so that the structure of the remaining encapsulation metal loop 130 will be regarded as the second metal wiring 132. In one embodiment of the disclosure, the second metal wiring 132 is reused as a ground wire of the organic light-emitting display panel, so that the second metal wiring 132 can not only function to reflect laser and melt the sealant fully by the reflected laser 140, but also remove the static electricity in the array substrate 110 to prevent static electricity.

Figure 4B:
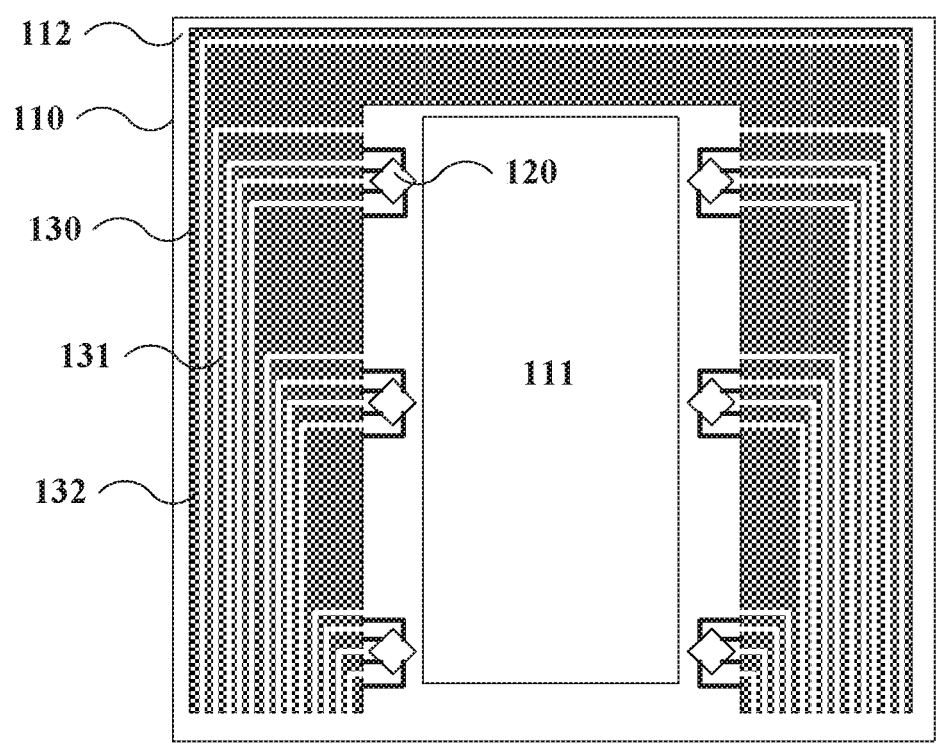
FIG. 4B is a schematic diagram of another organic light-emitting display panel according to an embodiment of the disclosure.

In one embodiment, In other embodiments, as shown in FIG. 4B, it is a schematic diagram of another organic light-emitting display panel according to an embodiment of the disclosure. In this embodiment of the disclosure, the remaining structure of the encapsulation metal loop 130 after a plurality of first metal wirings 131 are etched is a complete circular structure, and a second metal wiring 132 surrounding the display region 111 is partitioned from the remaining encapsulation metal loop structure. The second metal wiring 132 can not only function to reflect laser and melt the sealant fully by the reflected laser 140, but also can remove the static electricity in the array substrate 110 to prevent static electricity.

It may be understood by one skilled in the art that, the partition mode of the second metal wiring is not specifically limited in the disclosure.

Figure 5A:
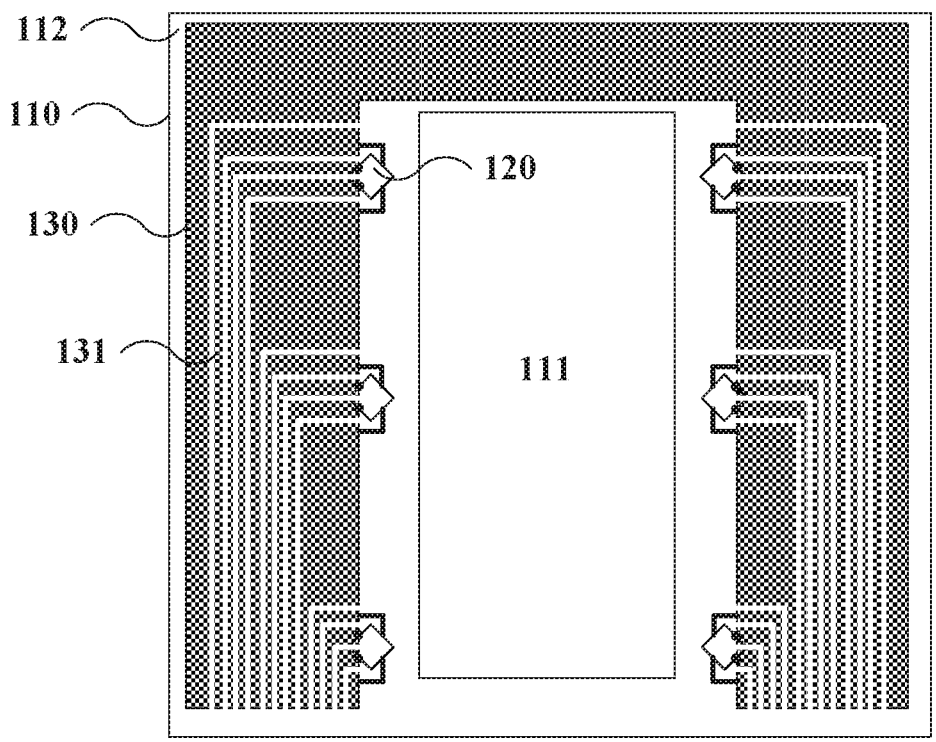
FIG. 5A is a schematic diagram of another organic light-emitting display panel according to an embodiment of the disclosure.

In one embodiment, referring to FIG. 5A, FIG. 5A is a schematic diagram of another organic light-emitting display panel according to an embodiment of the disclosure. The difference from any of the above organic light-emitting display panels lies in that, in this embodiment of the disclosure, the projection of the encapsulation metal loop 130 in the direction vertical to the organic light-emitting display panel covers at least a part of the pressure-sensitive detection unit 120. When the projection of the encapsulation metal loop 130 in the direction vertical to the organic light-emitting display panel covers at least a part of the pressure-sensitive detection unit 120, the film layer of the encapsulation metal loop 130 and the film layer of the pressure-sensitive detection unit 120 are located on different layers, so that the first metal wiring 131 is electrically connected with the pressure-sensitive detection unit 120 by a via hole. In one embodiment, the pressure-sensitive detection unit 120 is provided on the edge of the display region 111 or in the non-display region 112, and thereby the display effect would not be affected by the pressure-sensitive detection unit 120 and the pressure-sensitive wiring thereof.

Figure 5B:
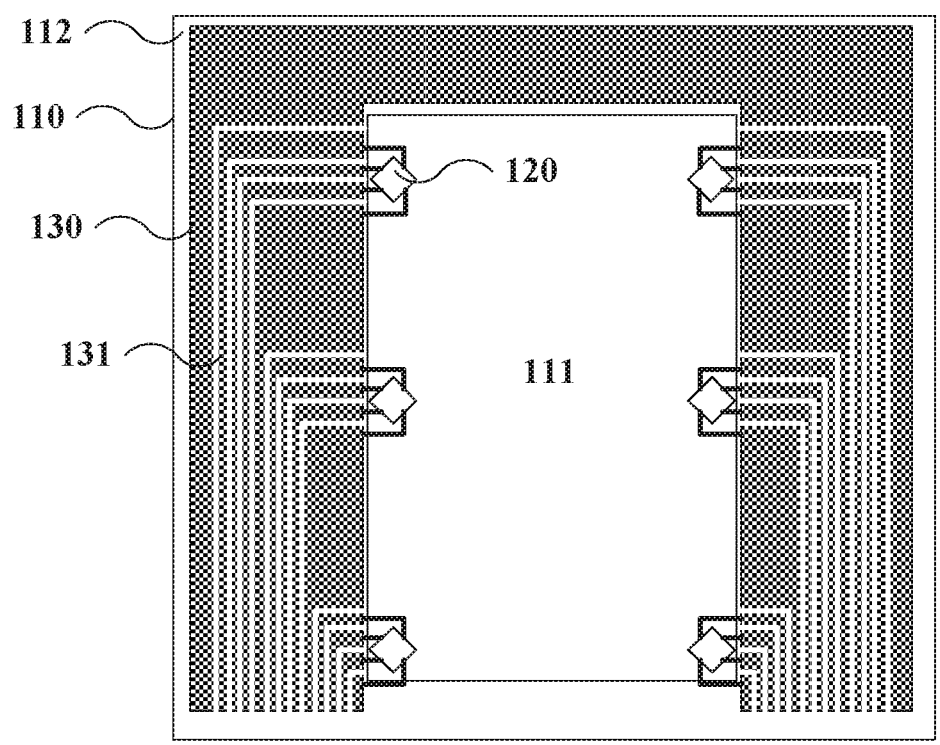
FIG. 5B is a schematic diagram of another organic light-emitting display panel according to an embodiment of the disclosure.

In one embodiment, referring to FIG. 5B, FIG. 5B is a schematic diagram of another organic light-emitting display panel according to an embodiment of the disclosure. The difference from any of the above organic light-emitting display panels lies in that, in this embodiment of the disclosure, the projection of the encapsulation metal loop 130 in the direction vertical to the organic light-emitting display panel does not overlap with the pressure-sensitive detection unit 120. When the projection of the encapsulation metal loop 130 in the direction vertical to the organic light-emitting display panel does not overlap with the pressure-sensitive detection unit 120, the film layer of the encapsulation metal loop 130 and the film layer of the pressure-sensitive detection unit 120 may be located on the same layer or on different layers. In one embodiment, as shown in FIG. 5B, the pressure-sensitive detection unit 120 is provided in the display region 111, or as shown in FIG. 1A, the pressure-sensitive detection unit 120 is provided in the non-display region 112. It may be understood by one skilled in the art that, the pressure-sensitive detection unit may be provided appropriately to avoid the effect of the pressure-sensitive detection unit and the pressure-sensitive wiring thereof on the display effect.

Figure 6:
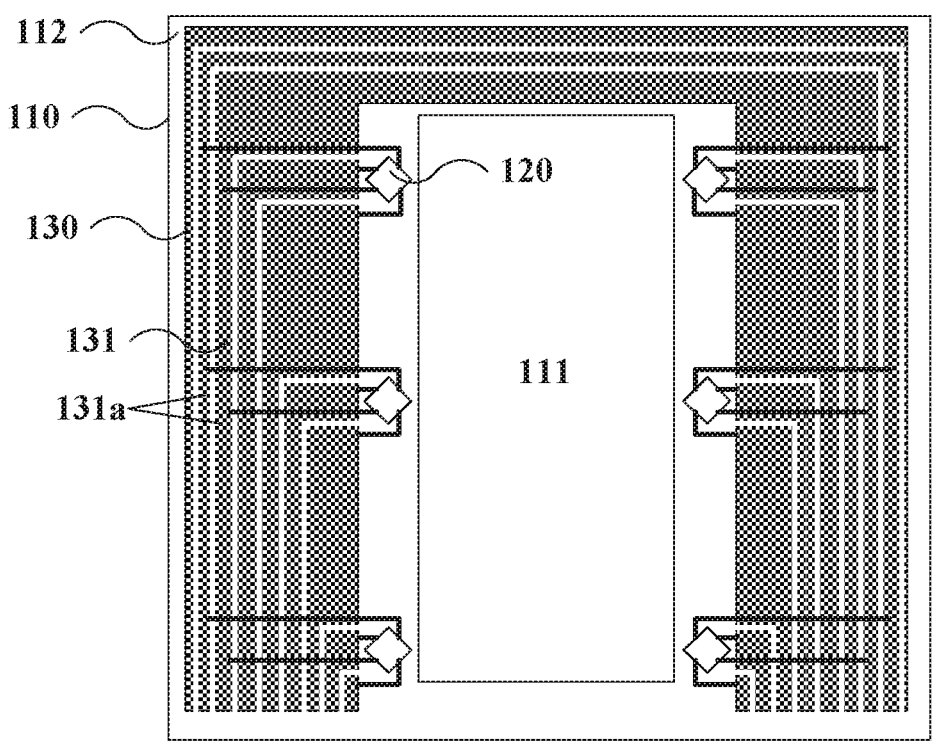
FIG. 6 is a schematic diagram of another organic light-emitting display panel according to an embodiment of the disclosure.
Figure 7A:
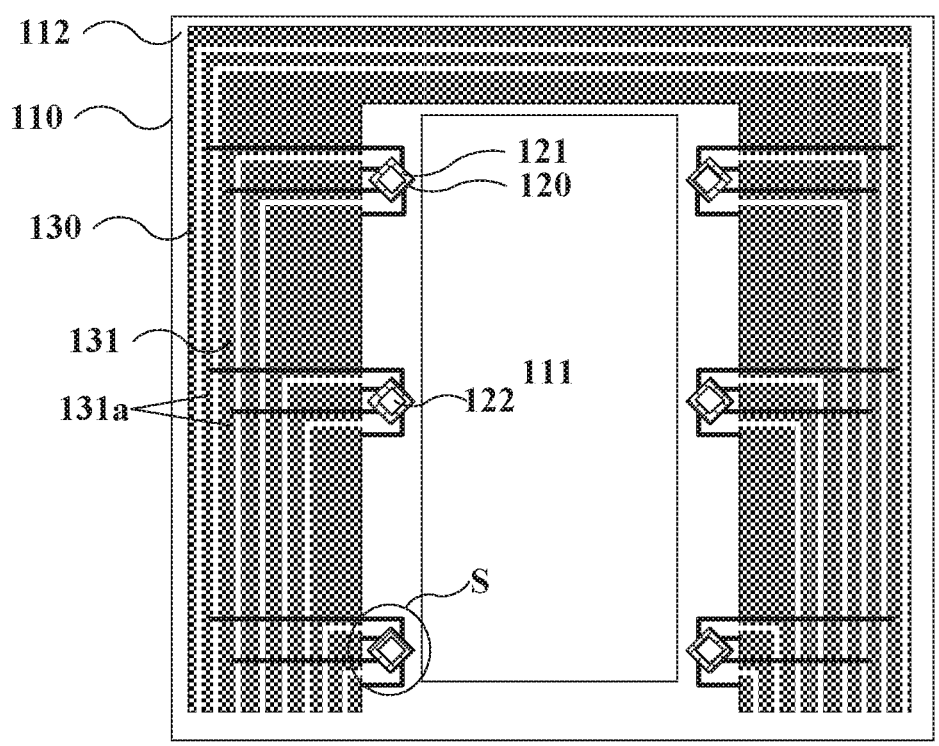
FIG. 7A is a schematic diagram of another organic light-emitting display panel according to an embodiment of the disclosure.
Figure 7B:
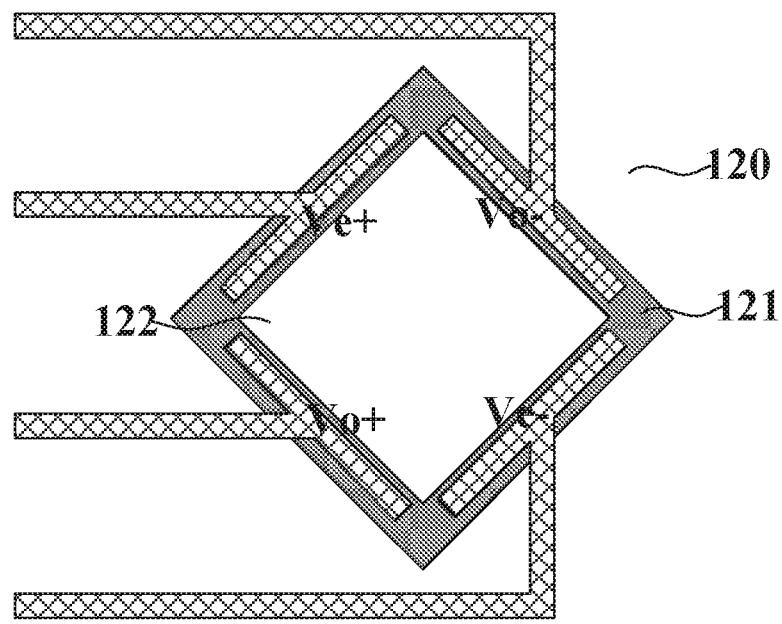
FIG. 7B is an enlarged view of region S of FIG. 7A.

In one embodiment, referring to FIG. 6, FIG. 6 is a schematic diagram of another organic light-emitting display panel according to an embodiment of the disclosure. The difference from any of the above organic light-emitting display panels lies in that, in this embodiment of the disclosure, the plurality of first metal wirings 131 includes two voltage input wires 131a, and the voltage input terminals of each of pressure-sensitive detection units 120 are electrically connected with the two voltage input wires 131a. In one embodiment of the disclosure, the voltage input wire 131a is provided as the pressure-sensitive drive wiring of the pressure-sensitive detection unit 120. In the pressure-sensitive detection stage, the organic light-emitting display panel inputs a pressure-sensitive drive signal to the corresponding pressure-sensitive detection unit 120 via two pressure-sensitive drive wirings. The pressure-sensitive drive signal received by each pressure-sensitive detection unit 120 in the organic light-emitting display panel is the same signal, so that each pressure-sensitive detection unit 120 in the organic light-emitting display panel share a pressure-sensitive drive wiring. That is, the plurality of first metal wirings 131 partitioned from the encapsulation metal wire 130 include two voltage input wires 131a, and both of the two voltage input terminals of each pressure-sensitive detection unit 120 in the organic light-emitting display panel are electrically connected with the two voltage input wires 131a. Therefore, the number of the first metal wirings 131 partitioned from the encapsulation metal wire 130 may be reduced, and hence the number of the slits in the encapsulation metal loop 130 may be reduced, thereby improving the effect that the encapsulation metal wire 130 reflects the laser to melt the sealant fully by the reflected laser In one embodiment, referring to FIG. 7A and FIG. 7B, FIG. 7A is a schematic diagram of another organic light-emitting display panel according to an embodiment of the disclosure, and FIG. 7B is an enlarged view of region S of FIG. 7A. In one embodiment of the disclosure, the pressure-sensitive detection unit 120 may be a semiconductor pressure sensor, and the semiconductor pressure sensor includes a semiconductor material film 121, two voltage input terminals (Vo+, Vo−) and two voltage output terminals (Ve+, Ve−). The difference from any of the above organic light-emitting display panels lies in that, in this embodiment of the disclosure, the plurality of first metal wirings 131 includes two voltage input wires 131a, the voltage input terminals of each of the pressure-sensitive detection units 120 are electrically connected with the two voltage input wires 131a, and the center region of the semiconductor material film 121 has an opening 122.

In one embodiment of the disclosure, the pressure-sensitive drive signal received by the voltage input terminal of each pressure-sensitive detection unit 120 in the organic light-emitting display panel is the same, so that each pressure-sensitive detection unit 120 shares two voltage input wires 131a. However, since there is a loss in transmitting a signal on wirings, a large difference may be present between the pressure-sensitive drive signal received by the pressure-sensitive detection unit 120 at the near end of the voltage input wire 131a and the pressure-sensitive drive signal received by the pressure-sensitive detection unit 120 at the far end of the voltage input wire 131a, thereby causing a poor precision of the pressure-sensitive detection result.

In one embodiment of the disclosure, the resistance of the pressure-sensitive detection unit 120 can be increased by providing an opening 122 in the center region of the semiconductor material film 121 of the pressure-sensitive detection unit 120, and hence the loss of the pressure-sensitive drive signal by the pressure-sensitive detection unit 120 can be reduced, so that the difference between the pressure-sensitive drive signals received by the pressure-sensitive detection unit 120 at the near end of the voltage input wire 131a and the pressure-sensitive detection unit 120 at the far end of the voltage input wire 131a can be lowered, thereby improving the precision of the pressure-sensitive detection result.

Figure 8:
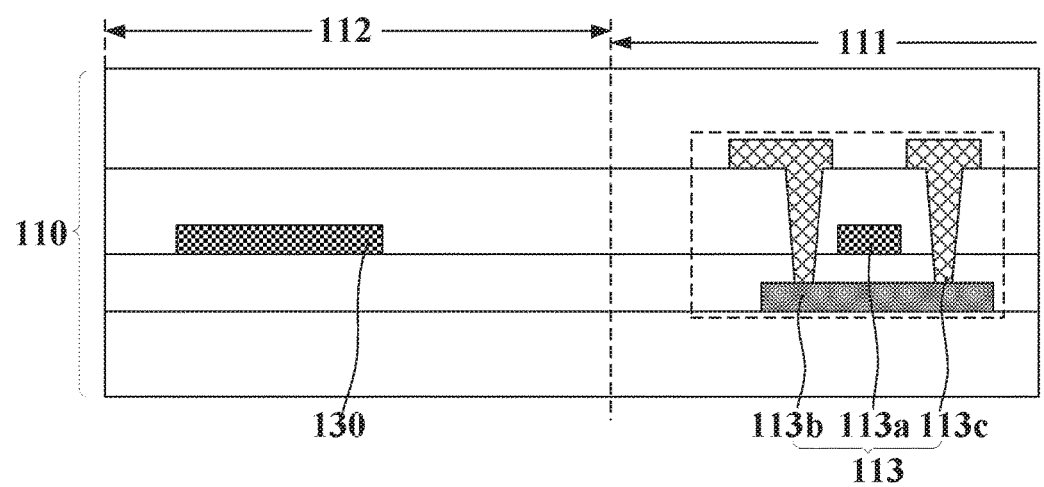
FIG. 8 is a sectional view of another organic light-emitting display panel according to an embodiment of the disclosure.

In one embodiment, referring to FIG. 8, FIG. 8 is a sectional view of another organic light-emitting display panel according to an embodiment of the disclosure. In one embodiment of the disclosure, the array substrate 110 includes a plurality of thin-film transistors 113, and the thin-film transistor 113 includes a first gate electrode 113a, a first active layer 113b and a first drain electrode 113c. In one embodiment, the first gate electrode 113a and the encapsulation metal loop 130 are provided on the same layer. The thin-film transistor 113 in the array substrate 110 is provided as a pixel switch, which is electrically connected with the corresponding organic light-emitting structure (not shown) and configured to be turned on according to a time sequence in the display stage to transmit a pixel voltage signal to the organic light-emitting structure. The encapsulation metal loop 130 is configured to reflect laser to melt the sealant fully by the reflected laser. Specifically, the encapsulation metal loop 130 is located in the non-display region 112 of the array substrate 110 and surrounds the display region 111. FIG. 8 only shows one thin-film transistor 113 located on the outmost side in the display region 111 and an encapsulation metal loop 130 provided in the non-display region 112.

In one embodiment of the disclosure, one mask is employed to form both the encapsulation metal loop 130 and the first gate electrode 113a of the thin-film transistor 113, and the materials of the encapsulation metal loop 130 and the first gate electrode 113a of the thin-film transistor 113 may be the same. As a result, not only one mask process can be reduced, but also the cost can be lowered, the manufacture process may be reduced, and the thickness of the organic light-emitting display panel can be reduced.

Figure 9:
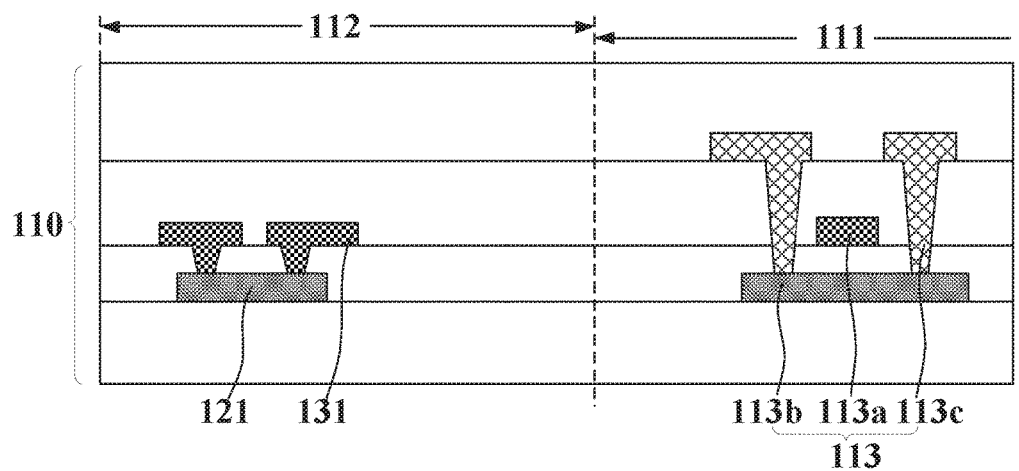
FIG. 9 is a sectional view of another organic light-emitting display panel according to an embodiment of the disclosure.

In one embodiment, referring to FIG. 9, FIG. 9 is a sectional view of another organic light-emitting display panel according to an embodiment of the disclosure. In one embodiment of the disclosure, the array substrate 110 includes a plurality of thin-film transistors 113, and the thin-film transistor 113 includes a first gate electrode 113a, a first active layer 113b and a first drain electrode 113c. In one embodiment, the pressure-sensitive detection unit 120 may be a semiconductor pressure sensor, and the semiconductor pressure sensor includes a semiconductor material film 121; the first active layer 113b and the semiconductor material film 121 are provided on the same layer.

The constructional material of the semiconductor material film 121 of the pressure-sensitive detection unit 120 may be amorphous silicon a-Si or polysilicon poly-Si, and the constructional material of the first active layer 113b of the thin-film transistor 113 may be polysilicon poly-Si or amorphous silicon a-Si. Therefore, in one embodiment of the disclosure, the semiconductor material film 121 and the first active layer 113b are provided on the same layer. Specifically, the semiconductor material film 121 and the first active layer 113b may be made of the same constructional material and formed on the same layer via one mask. As a result, the thin-film transistor 113 and the pressure-sensitive detection unit 120 can be formed on the organic light-emitting display panel without adding the process and the cost. It needs to be noted that, in other embodiments, the constructional material of the first active layer of the thin-film transistor may further be a semiconductor oxide such as zinc oxide, indium oxide and tin oxide, etc., or it may be an alloy of zinc oxide, indium oxide and tin oxide, etc. In one embodiment, the semiconductor material film of the pressure-sensitive detection unit and the first active layer of the thin-film transistor may be provided on the same layer.

In one embodiment, the first gate electrode 113a of the thin-film transistor 113 and the encapsulation metal loop 130 may be provided on the same layer, and the semiconductor material film 121 of the pressure-sensitive detection unit 120 and the first active layer 113b may be provided on the same layer, so that the projection of the semiconductor material film 121 of the pressure-sensitive detection unit 120 in the direction vertical to the organic light-emitting display panel overlaps with the encapsulation metal loop 130, and the first metal wiring 131 in the encapsulation metal loop 130 is electrically connected with the pressure-sensitive detection unit 120 by a via hole. In one embodiment of the disclosure, the original film layer in the array substrate 110 is reused to manufacture the pressure-sensitive detection unit 120, so that the manufacture cost and process may be lowered; and the projection of the semiconductor material film 121 of the pressure-sensitive detection unit 120 in the direction vertical to the organic light-emitting display panel overlaps with the encapsulation metal loop 130, and hence the frame area of the organic light-emitting display panel occupied by the pressure-sensitive detection unit 120 is reduced, thereby realizing narrow frame.

In other embodiments of the disclosure, further the projection of the semiconductor material film of the pressure-sensitive detection unit in the direction vertical to the organic light-emitting display panel does not overlap with the encapsulation metal loop, and the relative location relation between the pressure-sensitive detection unit and the encapsulation metal loop is not defined in the disclosure.

Figure 10:
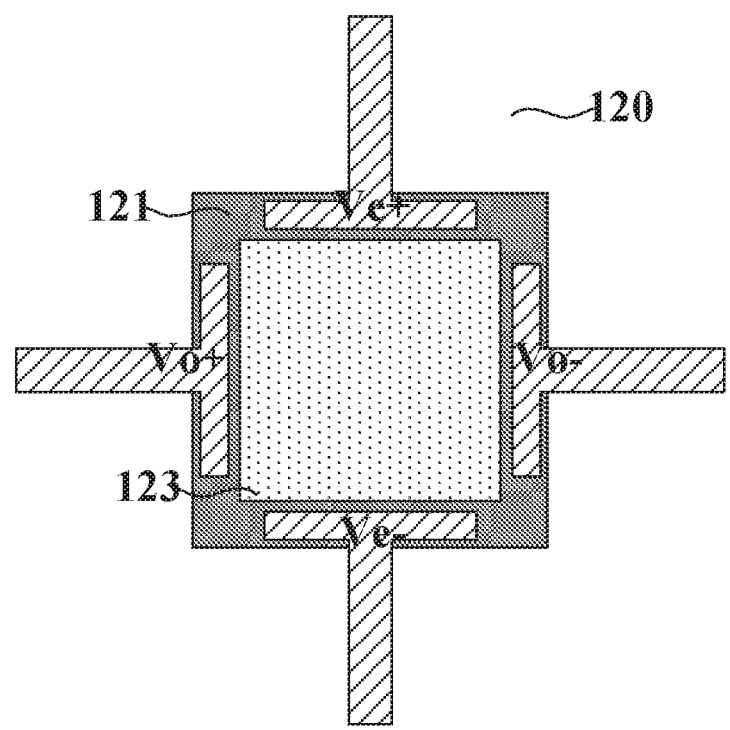
FIG. 10 is a schematic diagram of another pressure-sensitive detection unit according to an embodiment of the disclosure.

In one embodiment, referring to FIG. 10, FIG. 10 is a schematic diagram of another pressure-sensitive detection unit according to an embodiment of the disclosure. In one embodiment of the disclosure, the pressure-sensitive detection unit 120 may be a semiconductor pressure sensor, and the semiconductor pressure sensor includes two voltage input terminals (Vo+, Vo−) and two voltage output terminals (Ve+, Ve−); the semiconductor pressure sensor further includes a control terminal 123, and the control terminal 123 is configured to control the turning on or turning off of the voltage input terminal of the semiconductor pressure sensor, and/or, the control terminal is configured to control the turning on or turning off of the voltage output terminal of the semiconductor pressure sensor. In one embodiment of the disclosure, the constructional material of the semiconductor material film 121 of the semiconductor pressure sensor may generally be amorphous silicon a-Si or polysilicon poly-Si, and under an external electric field, the amorphous silicon a-Si or polysilicon poly-Si may form a conducting layer, i.e., a channel.

In one embodiment of the disclosure, the control terminal 123 of the semiconductor pressure sensor is configured to control the turning on or turning off of the voltage input terminal of the semiconductor pressure sensor. When a control voltage signal higher than the turned-on voltage is applied to the control terminal 123, a conducting channel along the direction of the straight line including the two voltage input terminals (Vo+, Vo−) will be formed in the semiconductor material film 121, so that the two voltage input terminals can be electrically connected, and the organic light-emitting display panel may applied a pressure-sensitive drive signal to the semiconductor pressure sensor that is turned on; on the contrary, the two voltage input terminals are turned off, and the pressure-sensitive drive signal of the organic light-emitting display panel cannot be applied to the semiconductor pressure sensor that is turned off.

In one embodiment of the disclosure, the control terminal 123 of the semiconductor pressure sensor can be further configured to control the turning on or turning off of the voltage output terminal of the semiconductor pressure sensor. When a control voltage signal higher than the turned-on voltage is applied to the control terminal 123, a conducting channel along the direction of the straight line including the two voltage output terminals (Ve+, Ve−) will be formed in the semiconductor material film 121, so that the two voltage output terminals can be electrically connected, and the organic light-emitting display panel may acquire, via the pressure-sensitive induction wiring, the pressure-sensitive induction signal generated by the semiconductor pressure sensor that is turned on; on the contrary, the two voltage output terminals are turned off, and the pressure-sensitive induction signal generated by the semiconductor pressure sensor cannot be output.

In one embodiment of the disclosure, the semiconductor pressure sensor is provided with a control terminal 123, so that the organic light-emitting display panel may separately control the semiconductor pressure sensors, for example, control the two voltage input terminals of at least one semiconductor pressure sensor to be turned on to apply a pressure-sensitive drive signal to the semiconductor pressure sensor that is turned on, and/or, control the two voltage output terminals of one semiconductor pressure sensor to be turned on to acquire the pressure-sensitive induction signal generated by the semiconductor pressure sensor that is turned on.

Figure 11:
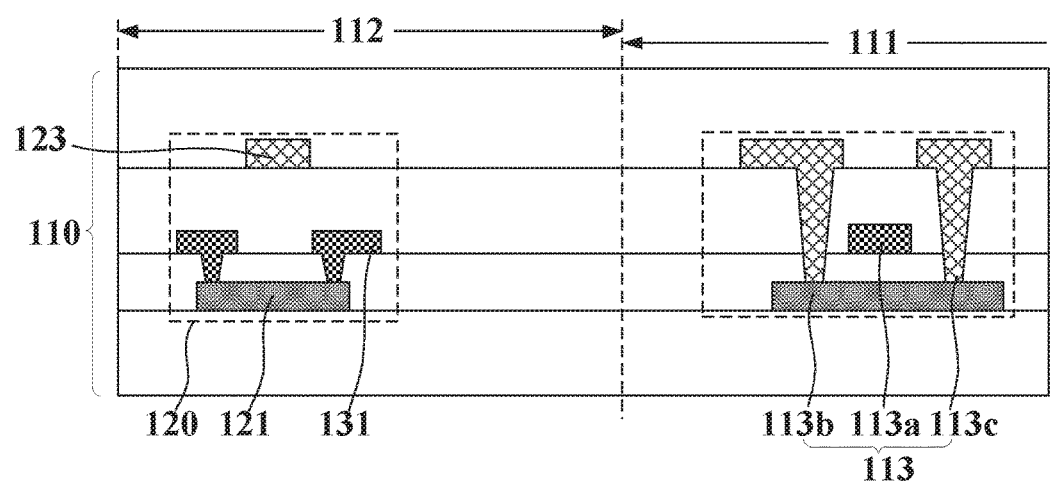
FIG. 11 is a sectional view of another organic light-emitting display panel according to an embodiment of the disclosure.

In one embodiment, on the basis of FIG. 10, referring to FIG. 11, FIG. 11 is a sectional view of another organic light-emitting display panel according to an embodiment of the disclosure. In one embodiment of the disclosure, the array substrate 110 includes a plurality of thin-film transistors 113, and the thin-film transistor 113 includes a first gate electrode 113*a*, a first active layer 113*b* and a first drain electrode 113*c*. In one embodiment of the disclosure, further the first drain electrode 113*c* and the control terminal 123 are provided on the same layer. In one embodiment of the disclosure, the control terminal 123 of the pressure-sensitive detection unit 120 and the first drain electrode 113*c* may be made of the same constructional material and formed on the same layer via one mask. As a result, the source-drain electrodes of the thin-film transistor 113 and the control terminal 123 of the pressure-sensitive detection unit 120 can be formed in the organic light-emitting display panel without adding the process and the cost. It may be understood by one skilled in the art that, the film layer structures of the control terminal and the pressure-sensitive wiring of the pressure-sensitive detection unit include, but are not limited to, the structures shown above, and the film layer structures of the control terminal and the pressure-sensitive wiring, etc., of the pressure-sensitive detection unit may be provided reasonably without affection on the display of the organic light-emitting display panel.

Figure 12:
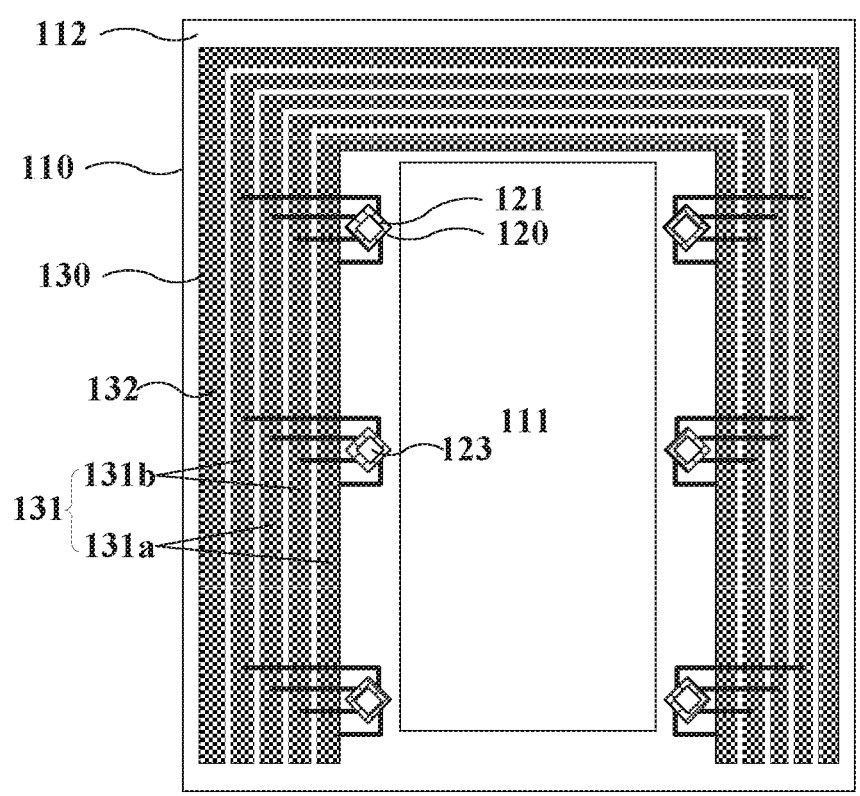
FIG. 12 is a schematic diagram of another organic light-emitting display panel according to an embodiment of the disclosure.

In one embodiment, on the basis of FIG. 10, referring to FIG. 12, FIG. 12 is a schematic diagram of another organic light-emitting display panel according to an embodiment of the disclosure. The difference from any of the above organic light-emitting display panels lies in that, in this embodiment of the disclosure, the plurality of first metal wirings 131 further include two voltage output wires 131*b*, and the voltage output terminals of each of the pressure-sensitive detection units 120 are electrically connected with two voltage output wires 131*b*.

In one embodiment of the disclosure, the pressure-sensitive detection unit 120 is a semiconductor pressure sensor, and the pressure-sensitive detection unit 120 is provided with a control terminal 123, so that the organic light-emitting display panel may separately control the pressure-sensitive detection units 120. Specifically, the organic light-emitting display panel may separately control the turning on or turning off of the two voltage output terminals of each of the pressure-sensitive detection units 120. Thus, each of the pressure-sensitive detection units 120 in the organic light-emitting display panel may share two voltage output wires 131b. In one embodiment of the disclosure, further the plurality of first metal wirings 131 includes two voltage input wires 131a, and the voltage input terminals of each of the pressure-sensitive detection units 120 are electrically connected with the two voltage input wires 131a. In the organic light-emitting display panel, the pressure-sensitive drive signals applied to pressure-sensitive detection units 120 are the same as each other, and based on this, each of the pressure-sensitive detection units 120 may share two voltage input wires 131a.

In one embodiment of the disclosure, merely four first metal wirings 131 are needed to be partitioned from the encapsulation metal loop 130, such that the four first metal wirings 131 can not only function to reflect laser to melt the sealant fully by the reflected laser, but also function as the four pressure-sensitive wirings of each pressure-sensitive detection unit 120, and thus the number of wirings of the pressure-sensitive detection unit 120 can be reduced effectively. Based on the function of the encapsulation metal loop 130 to reflect laser to melt the sealant fully by the reflected laser, the number of wirings partitioned from the encapsulation metal loop 130 is reduced, so that the number of the slits in the encapsulation metal loop 130 is reduced, and hence the effect of the slits on the function of the encapsulation metal loop 130 can be lowered, and the function of the encapsulation metal loop 130 to reflect laser to melt the sealant fully by the reflected laser in the organic light-emitting display panel can be guaranteed. A second metal wiring 132 located on the outmost periphery of the first metal wiring 131 may be further partitioned from the encapsulation metal loop 130, and the second metal wiring 132 may function as the ground wire of the organic light-emitting display panel, the static electricity in the array substrate 110 can be removed, thereby preventing static electricity.

In one embodiment of the disclosure, in the pressure-sensitive detection stage, the organic light-emitting display panel applies a pressure-sensitive drive signal to each of the pressure-sensitive detection units 120 via two voltage input wires 131a; when a pressure-sensitive induction signal is acquired, the organic light-emitting display panel may time-division control each of the pressure-sensitive detection units 120 to be turned on one by one, so that the organic light-emitting display panel may time-division acquire the pressure-sensitive induction signal generated by each of the pressure-sensitive detection units 120 via two voltage output wires 131b. The organic light-emitting display panel judges whether it is pressed and judges the press degree according to the pressure-sensitive induction signal of each of the pressure-sensitive detection units 120.

Figure 13:
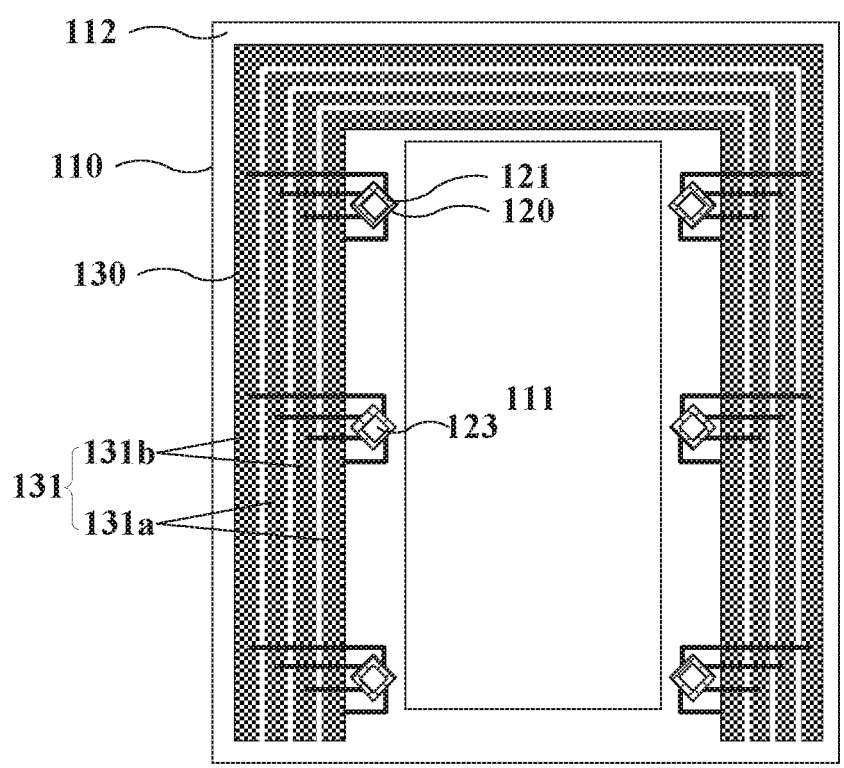
FIG. 13 is a schematic diagram of another organic light-emitting display panel according to an embodiment of the disclosure.

In one embodiment, on the basis that FIG. 12, referring to FIG. 13, FIG. 13 is a schematic diagram of another organic light-emitting display panel according to an embodiment of the disclosure. The difference from any of the above organic light-emitting display panels lies in that, in this embodiment of the disclosure, one of the two voltage output wires 131b is provided on the outmost periphery of the plurality of first metal wirings 131 departing from the display region 111, and said voltage output wire 131b is reused as a ground wire of the organic light-emitting display panel. In one embodiment of the disclosure, the voltage output wire 131b on the outmost periphery is reused as the ground wire, so that the voltage output wire 131b can not only function to reflect laser to melt the sealant fully by the reflected laser, but also function as a transmission wiring of the pressure-sensitive induction signal in the pressure-sensitive detection stage, and remove the static electricity in the array substrate 110 and function to prevent static electricity in other stages; moreover, the voltage output wire 131b is partitioned from the encapsulation metal loop 130, so that the voltage output wire 131b still has the function of reflecting laser to melt the sealant fully by the reflected laser.

Figure 14:
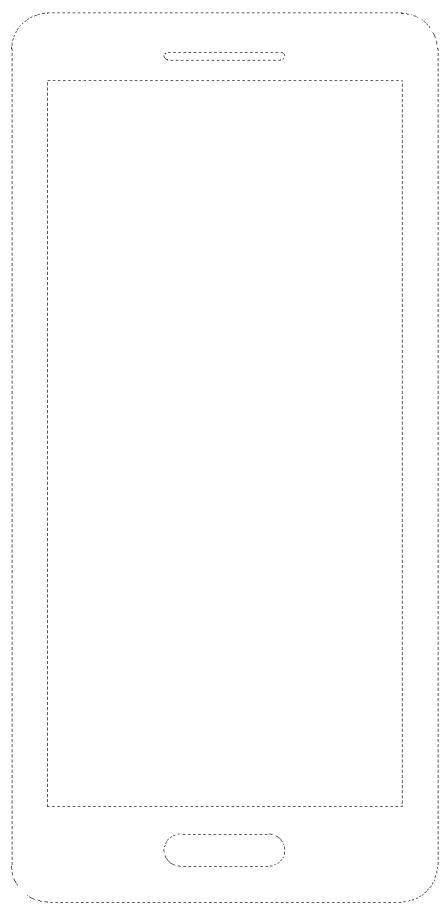
FIG. 14 is a schematic diagram of an electronic device according to an embodiment of the disclosure.

Embodiments of the disclosure further provide an electronic device, which includes any of the above organic light-emitting display panels. The electronic device may be any organic light-emitting display device equipped with an organic light-emitting display panel, for example, an intelligent mobile phone and a tablet computer, etc., which is not specifically limited in the disclosure. Referring to FIG. 14, FIG. 14 is a schematic diagram of an electronic device according to an embodiment of the disclosure, and the electronic device includes an intelligent mobile phone.

In the electronic device according to one embodiment of the disclosure, the encapsulation metal loop is reused in the organic light-emitting display panel as the pressure-sensitive wiring of the pressure-sensitive detection unit, and hence no pressure-sensitive wiring of the pressure-sensitive detection units needs to be provided additionally, and the frame area occupied by the pressure-sensitive wiring may be reduced, thereby realizing narrow frame.

It needs to be noted that, each of the above drawings only shows a partial structure or a local structure of an organic light-emitting display panel, rather than the whole structure of the organic light-emitting display panel. For other structures or the whole structure of the organic light-emitting display panel, reference may be made to the existing organic light-emitting display panels, and no repeated description will be given again here.

It should be noted that various embodiments of the present invention and the technical principles used therein are described as above. It should be appreciated that the invention is not limited to the particular embodiments described herein, and any apparent alterations, modification and substitutions can be made without departing from the scope of protection of the invention. Accordingly, while the invention is described in detail through the above embodiments, the invention is not limited to the above embodiments and can further include other additional embodiments without departing from the concept of the invention.

What is claimed is:

1. An organic light-emitting display panel, comprising:
    an array substrate, wherein the array substrate comprises a display region and a non-display region surrounding the display region; and wherein the array substrate further comprises a plurality of pressure-sensitive detection units and an encapsulation metal loop located in the non-display region and surrounding the display region, a plurality of first metal wirings are partitioned from the encapsulation metal loop, the plurality of first metal wirings are electrically connected with the plurality of pressure-sensitive detection units, and the plurality of first metal wirings are reused as pressure-sensitive wirings of the plurality of pressure-sensitive detection units; and
    a sealant, wherein the sealant is located on one side of the array substrate that faces away from the encapsulation metal loop, and a projection of the sealant on the encapsulation metal loop overlaps with the encapsulation metal loop.

2. The organic light-emitting display panel as claimed in claim 1, wherein
    the encapsulation metal loop has a plurality of openings.

3. The organic light-emitting display panel as claimed in claim 1, wherein
a second metal wiring surrounding the display region is also partitioned from the encapsulation metal loop, the second metal wiring is located on an outmost side of the plurality of first metal wirings and surrounds the plurality of first metal wirings, and the second metal wiring is reused as a ground wire of the organic light-emitting display panel.

4. The organic light-emitting display panel as claimed in claim 1, wherein
the pressure-sensitive detection unit comprises a metal-bridge pressure sensor, and the metal-bridge pressure sensor comprises four resistors, two voltage input terminals and two voltage output terminals.

5. The organic light-emitting display panel as claimed in claim 1, wherein
the pressure-sensitive detection unit comprises a semiconductor pressure sensor, and the semiconductor pressure sensor comprises a semiconductor material film, two voltage input terminals and two voltage output terminals.

6. The organic light-emitting display panel as claimed in claim 5, wherein
the plurality of first metal wirings comprise two voltage input wires, and a voltage input terminals of each of the pressure-sensitive detection units are electrically connected with the two voltage input wires, and a center region of the semiconductor material film has an opening.

7. The organic light-emitting display panel as claimed in claim 1 wherein
a projection of the encapsulation metal loop in a direction vertical to the organic light-emitting display panel covers at least a part of the pressure-sensitive detection unit.

8. The organic light-emitting display panel as claimed in claim 1 wherein
a projection of the encapsulation metal loop in a direction vertical to the organic light-emitting display panel does not overlap with the pressure-sensitive detection unit.

9. The organic light-emitting display panel as claimed in claim 1 wherein
the plurality of first metal wirings comprise two voltage input wires, and the voltage input terminals of each of the pressure-sensitive detection units are electrically connected with the two voltage input wires.

10. The organic light-emitting display panel as claimed in claim 1, wherein
the array substrate comprises a plurality of thin-film transistors, the thin-film transistor comprises a first gate electrode, a first active layer and a first drain electrode.

11. The organic light-emitting display panel as claimed in claim 10, wherein
the first gate electrode and the encapsulation metal loop are provided on the same layer.

12. The organic light-emitting display panel as claimed in claim 10, wherein
the pressure-sensitive detection unit is provided as a semiconductor pressure sensor, the semiconductor pressure sensor comprises a semiconductor material film, and the first active layer and the semiconductor material film are provided on the same layer.

13. The organic light-emitting display panel as claimed in claim 10, wherein
the pressure-sensitive detection unit comprises a semiconductor pressure sensor which comprises two voltage input terminals and two voltage output terminals; the semiconductor pressure sensor further comprises a control terminal, the control terminal is configured to control the turning-on and turning-off of the voltage input terminal of the semiconductor pressure sensor, and, the control terminal is configured to control the turning-on and turning-off of the voltage output terminal of the semiconductor pressure sensor.

14. The organic light-emitting display panel as claimed in claim 13, wherein
the plurality of first metal wirings further comprise two voltage output wires, the voltage output terminals of each of the pressure-sensitive detection units are electrically connected with the two voltage output wires.

15. The organic light-emitting display panel as claimed in claim 14, wherein
one of the two voltage output wires is provided on the outmost periphery of the plurality of first metal wirings departing from the display region, and the voltage output wire is reused as a ground wire of the organic light-emitting display panel.

16. The organic light-emitting display panel as claimed in claim 13, wherein, the first drain electrode and the control terminal are provided on the same layer.

17. An electronic device, comprising an organic light-emitting display panel which comprising:
an array substrate, wherein the array substrate comprises a display region and a non-display region surrounding the display region; and wherein the array substrate further comprises a plurality of pressure-sensitive detection units and an encapsulation metal loop located in the non-display region and surrounding the display region, a plurality of first metal wirings are partitioned from the encapsulation metal loop, the plurality of first metal wirings are electrically connected with the plurality of pressure-sensitive detection units, and the plurality of first metal wirings are reused as pressure-sensitive wirings of the plurality of pressure-sensitive detection units; and
a sealant, wherein the sealant is located on one side of the array substrate that faces away from the encapsulation metal loop, and a projection of the sealant on the encapsulation metal loop overlaps with the encapsulation metal loop.

* * * * *